United States Patent [19]

Van Alphen

[11] 4,398,896

[45] Aug. 16, 1983

[54] METHOD OF DE-BURRING AND CLEANING ELECTRODE SYSTEMS

[75] Inventor: Willem M. Van Alphen, Eindhoven, Netherlands

[73] Assignee: U.S. Philips Corporation, Tarrytown, N.Y.

[21] Appl. No.: 49,994

[22] Filed: Jun. 18, 1979

[30] Foreign Application Priority Data

Jun. 27, 1978 [NL] Netherlands .................. 7806868

[51] Int. Cl.$^3$ .................................. H01J 9/00
[52] U.S. Cl. .................................. 445/5; 445/46
[58] Field of Search ............... 316/1; 427/37; 445/5, 445/46

[56] References Cited

U.S. PATENT DOCUMENTS

| | | | |
|---|---|---|---|
| 2,791,022 | 5/1957 | Stuermer | 316/1 |
| 3,323,854 | 6/1967 | Palac | 316/1 |
| 3,434,770 | 3/1969 | Angelucci | 316/1 |
| 4,124,263 | 11/1978 | Neuber | 316/1 |

Primary Examiner—John D. Smith
Attorney, Agent, or Firm—Robert J. Kraus

[57] ABSTRACT

A method of de-burring and cleaning an electrode system, a printed circuit board, or the like comprising at least two conductors positioned at a predetermined distance from each other by means of insulation material. The electrode system is immersed in a dielectric liquid and an electric potential difference is then applied between the conductors which is sufficiently large to generate an electric flash-over between the conductors. As a result of the small free path length in the dielectric liquid metal sputtered from the conductors can not deposit on the insulating parts of the electrode system.

7 Claims, 5 Drawing Figures

METHOD OF DE-BURRING AND CLEANING ELECTRODE SYSTEMS

BACKGROUND OF THE INVENTION

This invention relates to a method of manufacturing an electrode system comprising at least two conductors positioned at a predetermined distance from each other by means of insulation material, in which burrs, if any, of the facing parts of said conductors are removed by applying an electric potential difference between the conductors, said difference being sufficiently large to generate an electric flash-over between the conductors.

The invention furthermore relates to an electrode system manufactured by using this method.

The term "electrode system" is to be understood to mean herein a system of electric conductors between which a strong electric field is generated in operating circumstances, for example, in electron gun systems, color selection electrodes with post-focusing effect for color display tubes and also printed circuit boards on whch conductive tracks extending closely beside each other are provided.

In electrode systems, such as, electron gun systems for cathode ray tubes, stringent requirements are imposed upon the high voltage stability of the electrode system. This means that the possibility of the occurrence of an electric flash-over between electrodes situated at a short distance from each other should be minimized in normal operating circumstances of the electrode system. In fact, such flash-overs may damage not only the electrode system itself but also the electronic circuit connected thereto. The cause of these flash-overs usually is mechanical imperfections of the electrode system, for example small burrs or loose particles present on the electrodes. It is therefore necessary to remove said burrs and loose particles from the electrodes before ultimately putting the electrode system in operation.

According to a conventional method, said burrs and loose particles are removed by applying, in the last or in one of the last phases of the manufacturing process of the electrode system, an electric potential difference between electrodes which are situated at a short distance from each other, said difference exceeding the voltage difference at which said electrodes are operated in normal operating circumstances. If a flash-over occurs, it will usually occur at the area of a burr or loose particle, as a result of which the burr or the loose particle is melted away or burnt away, so that the source of further flash-overs at that area has been removed. This process, sometimes termed "arc out process", usually takes place in a vacuum. During this arcing out, however, metal is sputtered which may deposit on electrically insulating parts of the electrode system. This has for its result that electric conductivity can take place via the walls of said insulating parts, which is undesirable. This is a problem in particular in electrode systems in which the insulation path along the insulating material between the electrodes is particularly short. Such an electrode system is disclosed, for example, in British Patent Specification No. 1,496,949. This specification described a colour display tube of the post-focussing type. In this case the colour selection electrode situated at a short distance before the display screen consists of two substantially flat electrode structures which are kept spaced at a distance of approximately 100 to 200 μm by means of insulators situated between the electrode structures. The two electrodes are provided with a plurality of apertures which are aligned two by two and through which pass the electron beams generated by an electron gun. The two electrode structures are operated at an electric potential difference of approximately 1000 to 2000 volts so as to exert in the apertures a focusing effect on the electron beams. Arcing out such an electrode system in a vacuum has proved to be an unfit method since the small deposit of sputtered metal on the insulators makes the colour selection electrode unfit for further use. Deposition of sputtered metal causes a problem in particular when a synthetic resin is used as an insulation material. Electric conductivity along the surface of the insulator then results in a local heating of said surface so that decompositon and carbon formation of the synthetic resin occurs. As a result of this the electric conductivity will increase and ultimately a complete short circuit is formed between the two electrode structures.

SUMMARY OF THE INVENTION

It is the object of the present invention to provide a method of arcing out electrode systems in which the deposition of sputtered material on insulating parts of the electrode system is avoided. For that purpose, a method of the kind mentioned in the preamble is characterized according to the invention in that the electrode system is immersed in a dielectric liquid, that is to say a strongly insulating liquid, so that at least the conductors to be arced out are situated below the liquid level and the potential difference for generating an electric flash-over is then applied between the conductors. When the electrode system is immersed in such a liquid and the desired electric potential difference is then applied between the conductors to be arced out, electric fields are formed having a strength of the same order of magnitude as in a vacuum. When an electric flash-over takes place towards a burr on one of the conductors, sputtering of metal also occurs, but this sputtered material can no longer deposit on the insulating parts of the electrode system as a result of the small path length in the dielectric liquid. The dielectric liquid also serves as a cooling liquid so that local over-heating as a result of the electric flash-overs is prevented.

Examples of dielectric liquids satisfying the object underlying the invention are halogenated hydrocarbons, for example, carbon tetrachloride and freons. Other examples of suitable liquids are inert gases in the liquid phase, preferably liquid nitrogen. Yet other examples of liquids are kerosene, drycleaning naptha, and paraffin oil. Generally, those dielectric liquids which can easily be evaporated or rinsed away from the electrode system are suitable.

During the arcing out of the electrode system it may occur that as a result of an electric flash-over small particles of solid are loosened from the insulating material or the electrode material. These particles are mainly taken along in the liquid flows which are formed as a result of the injection of charge carriers in the liquid in the proximity of the electrode system (electrohydrodynamic effect). The removal of these particles from the proximity of the electrode system can be promoted by causing the dielectric liquid to be circulated by a pump through a filter. A further possibility is to remove said particles from the proximity of the electroce system through electrostatic forces by means of an auxiliary electrode placed in the dielectric liquid.

BRIEF DESCRIPTION OF THE DRAWING

The invention will be described in greater detail with reference to the drawing in which.

BRIEF DESCRIPTION OF THE PREFERRED EMBODIMENTS

Figure 1:
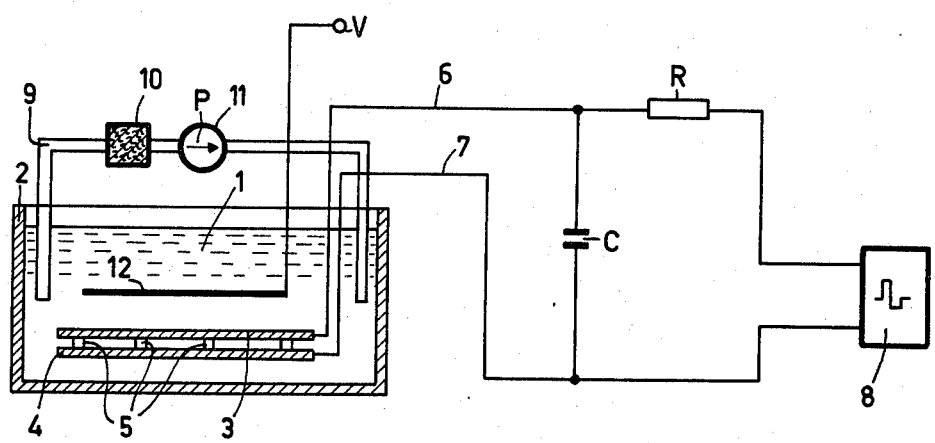
FIG. 1 shows diagrammatically an arrangement for carrying out the method according to the invention.

In FIG. 1, an electrode system consisting of a first electrode structure 3, a second electrode structure 4, and a number of insulators 5 arranged between the electrode structures and adhering thereto is situated in a container 2 filled with carbon tetrachloride. The electrode structures 3 and 4 are connected to a high voltage generator 8 via conductors 6 and 7 and a serially-connected impedance R. If desired, a capacitor C may be incorporated in the circuit in parallel with the electrode system, with which the quantity of energy available in an electric flash-over can be controlled at will. The potential difference between the electrode structures 3 and 4 necessary for arcing out the electrode system depends on the potential difference which, in normal operating circumstances, is between the electrode structures 3 and 4. For example, a voltage difference of approximately 3000 volts is sufficient when the normal operating voltage of the electrode system is approximately 2000 volts. For the arc out process, a voltage generator 8 is preferably used which provides voltage pulses or an alternating voltage so as to improve the voltage stability of the electrode system in both directions. If a burr is present on at least one of the facing surfaces of the electrode structures 3 and 4 or if a particle of solid has adhered thereto, an electric flash-over will occur at that area. As already stated, a capacitor C may be incorporated in the circuit, if desired, which discharges during said flash-over and the electric energy which is released usually is sufficient to melt away the burr or the particle of solid. The comparatively high impedance R of, for example, 5 MOhm prevents the formation of an arc discharge between the electrode structures 3 and 4 so as not to damage the electrode system itself. As a result of the small free path length in the liquid, the metal sputtered during the flash-over cannot deposit on the insulators 5. As a result of the electrohydrodynamic effect, a circulation of the liquid 1 is formed in the proximity of the electrode structures 3 and 4, in which particles of solid, if any, detached during the electric flash-over of the electrode system are taken along. If desired, said particles can be removed from the liquid 1 by circulating said liquid by pumping through a duct 9 in which a filter 10 and a pump 11 are incorporated.

It is alternatively possible to remove said particles electrostatically from the surroundings of the electrode system. For this purpose, at least one auxiliary electrode 12 is brought to such a potential that an electrostatic field extending outside the electrode system is generated. The particles, if any, detached during a flash-over are "pulled away" from the surroundings of the electrode system by electrostatic forces. Of course, in this case also, the pumping duct 9 may be used to remove the particles from the liquid.

Figure 2:
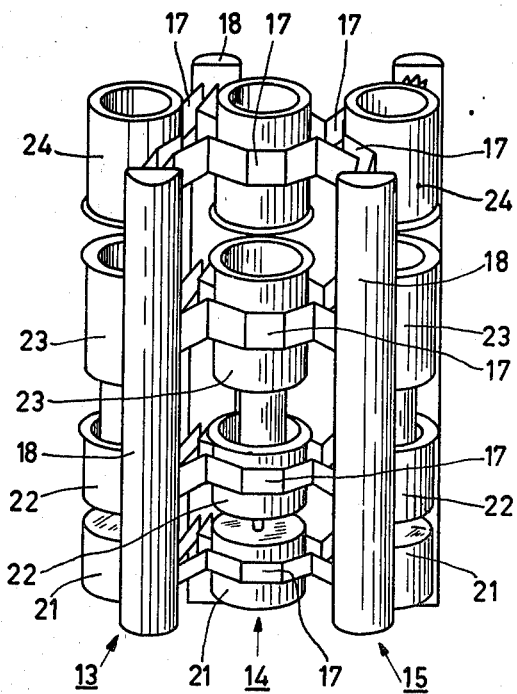
FIG. 2 shows an example of an electrode system manufactured by using the invention.

FIG. 2 shows an electrode system for a color television display tube which has been manufactured by using the invention. The electrode system comprises three electron guns 13, 14 and 15. Each gun has a first electrode 21, a second electrode 22, a third electrode 23 and a fourth electrode 24. These electrodes are positioned with respect to each other by means of metal strips 17 which are sealed during operation of glass assembly rods 18. In such an electron gun system, the electrodes 23 are at a potential of approximately 5 kV and the electrodes 24 are at a potential of approximately 25 kV. In order to minimize the possibility of the occurrence of an electric flash-over between the electrodes 23 and 24, the electron gun system has been arced out in a manner as described with reference to FIG. 1. Of course, a voltage generator should be used which provides considerably larger voltage pulses than the voltge difference which is between the electrodes 23 and 24 during operating conditions. Voltage differences of from 30 to 50 kV are sufficient for arcing out such an electrode system. The desired voltage difference can be obtained by means of voltage pulses which may be superimposed on a direct voltage level.

Figure 3A:
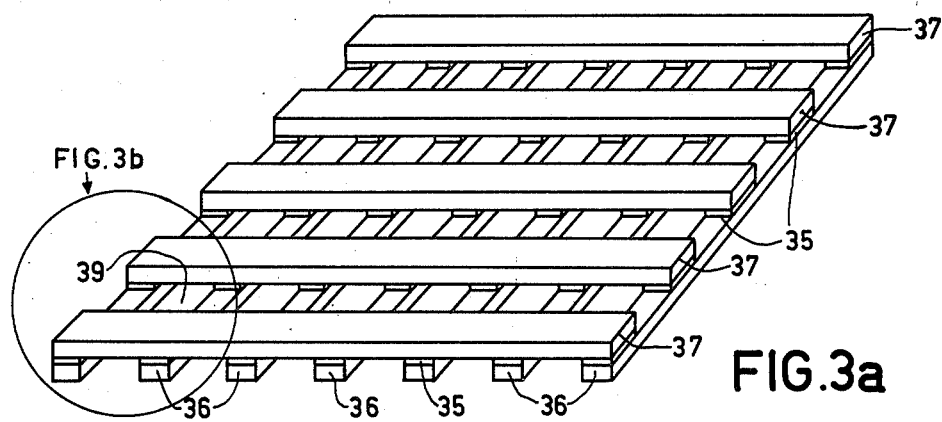
FIG. 3a shows another example of an electrode system manufactured by using the invention.
Figure 3B:
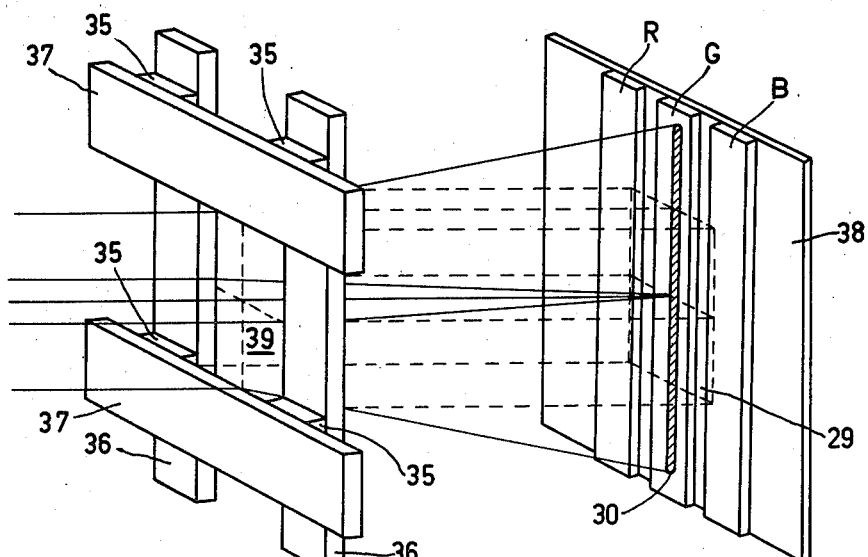
FIG. 3b shows a detail of the electrode system shown in FIG. 3a, and FIG. 4 shows a structure of electric conductors provided on an insulating plate.

FIG. 3a shows an electrode system which is constructed from two flat electrode structures. Such an electrode system is suitable for use as a color selection electrode in a colour television display tube of the post-focusing type. The electrode system comprises a first electrode structure consisting of a set of mutually-parallel metal conductors 37 and a second electrode structure consisting of a set of mutually parallel conductors 36 crossing the conductors 37 at right angles. The crossing conductors are kept spaced apart at a distance of approximately 150 $\mu$m by means of insulators 35, while apertures 39 are present between the conductors 36 and 37. For illustration, FIG. 3b shows diagrammatically the operation of such an electrode system in a colour television display tube. Shown is a display screen 38 on which three phosphor strips associated with an aperture 39 are provided and are denoted by R(red), G(green) and B(blue).

As regards the color selection, the electrode system shown operates analogously to the shadow mask known from color television display tubes, that is to say that three electron beams pass through the apertures 39 at a small angle with each other (the so-called color selection angle) and consequently each impinge only on phosphor strips of one colour. FIG. 3b shows only one electron beam, namely that one which imginges on the green phosphor strip G. The electron beam is focussed in the aperture 39 in such manner that the electron spot denoted by 30 is formed on the display screen 38 and not the electron spot 29 denoted in broken lines. In order to produce said focusing, the electrodes 36 are operated at a lower electric potential than the electrodes 37. For example, at a potential of the display screen 38 of 25 kV, the potential of the conductors 36 is approximately 24.5 kV and that of the conductors 37 is approximately 25.5 kV. For proper focusing of the electron beams in the apertures 39 good voltage stability of the electrode system is required. Due to the short insulation path (150 $\mu$m) between the electrodes 36 and 37, the arc out process for such an electrode system in a manner as described with reference to FIG. 1 presents great advantages as compared with arc out processes in a vacuum. For the arcing out of this electrode system, voltage pulses of approximately 3 kV are sufficient. The required time for the arcing out may differ for different electrode systems but generally is approximately one minute.

Figure 4:
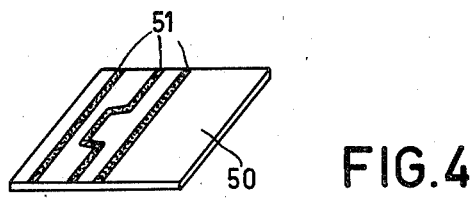

FIG. 4 relates to a part of an electric circuit in which electrically conductive tracks 51 are provided on an electrically insulating plate 50 (printed circuit board). In this case also, electric flash-overs may occur between the conductors 51 when a large potential difference exists between them during operation. The invention may be applied advantageously in the above-described manner by immersing the plate 50 in a dielectric liquid and applying a potential difference between the conductors 51 so as to arc out the conductors 51.

What is claimed:

1. In a method of manufacturing an electrode system having at least two conductors positioned at a predetermined distance from each other by means of insulation material, wherein burrs on the facing parts of said conductors are removed by an arc out process and wherein an electric potential is applied between the conductors, said potential being sufficiently large to produce an electric flash-over between the conductors the improvement comprising immersing the electrode system in a dielectric liquid with the conductors to be arced out situated below the liquid level of the dielectric liquid and then applying said potential between said conductors for generating an electric flash-over between the conductors.

2. A method as claimed in claim 1, wherein the dielectric liquid is a halogenated hydrocarbon.

3. A method as claimed in claim 1, wherein the dielectric liquid is an inert gas which is in the liquid phase.

4. A method as claimed in claim 3, wherein the dielectric liquid is liquid nitrogen.

5. A method as claimed in claim 1, 2, 3 or 4 wherein the dielectric liquid is circulated by pumping via a filter.

6. A method as claimed in any of the preceding Claims, characterized in that at least one auxiliary electrode is placed in the dielectric liquid in the proximity of the electrode system, which auxiliary electrode is brought at an electric potential such that an electrostatic field extending beyond the electrode system is obtained.

7. A method of manufacturing an electrode system having a plurality of spaced apart conductors, between which a high potential difference may exist in operation with a minimum occurrence of flash-over, wherein solid insulation is provided in a portion of the space between the conductors; said method comprising immersing the conductors of said system in a dielectric liquid, and applying a potential between said conductors to cause flash-over.

* * * * *

UNITED STATES PATENT AND TRADEMARK OFFICE
CERTIFICATE OF CORRECTION

PATENT NO. : 4,398,896
DATED : August 16, 1983
INVENTOR(S) : Willem M. Van Alphen It is certified that error appears in the above-identified patent and that said Letters Patent is hereby corrected as shown below:

On the title page, Item [73], "Tarrytown, N. Y." should read -- New York, N. Y. --.

Signed and Sealed this

Twenty-fifth Day of October 1983

[SEAL]

Attest:

Attesting Officer

GERALD J. MOSSINGHOFF

Commissioner of Patents and Trademarks